United States Patent [19]
Garyainov et al.

[11] 3,949,413
[45] Apr. 6, 1976

[54] SEMICONDUCTOR DIODE MATRIX

[76] Inventors: Stanislav Alexandrovich Garyainov, K-482, korpus 328, kv. 75; Veniamin Gavrilovich Rzhanov, K-460, korpus 212, kv. 57; Evgeny Nikolaevich Khrenov, K-482, korpus 323, kv. 30; Evdokia Kirillovna Shergold, K-489, korpus 616, kv. 104, all of Moscow, U.S.S.R.

[22] Filed: Mar. 25, 1974

[21] Appl. No.: 454,379

Related U.S. Application Data

[63] Continuation of Ser. No. 221,613, Dec. 23, 1971, abandoned.

[52] U.S. Cl. ................ 357/45; 357/46; 357/49; 357/50; 357/55; 357/68
[51] Int. Cl.² ............... H01L 27/10; H01L 27/02; H01L 29/06; H01L 23/48
[58] Field of Search ............ 357/45, 46, 49, 50, 55, 357/68

[56] References Cited
UNITED STATES PATENTS

| | | | |
|---|---|---|---|
| 3,382,115 | 5/1968 | Carter | 357/45 |
| 3,508,980 | 4/1970 | Jackson et al. | 357/45 |
| 3,509,433 | 4/1970 | Schroeder | 357/45 |

*Primary Examiner*—Stanley D. Miller, Jr.
*Assistant Examiner*—E. Wojciechowicz
*Attorney, Agent, or Firm*—Haseltine, Lake & Waters

[57] ABSTRACT

A semiconductor diode matrix with only slight difference in the characteristics, and good reproducibility of the diodes, and small resistance of the matrix lines, in which the diodes are formed on strips of semiconductor material, located in the body of the dielectric base layer. Each strip is surrounded from the side of the base layer by a layer of material having higher conductivity than the semiconductor material of the strip.

7 Claims, 1 Drawing Figure

U.S. Patent  April 6, 1976  3,949,413
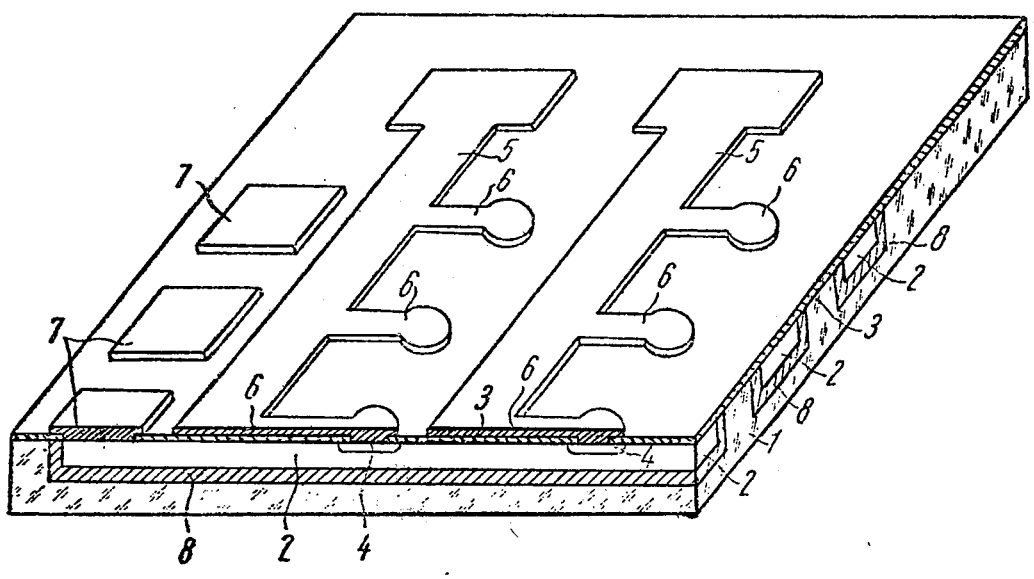

SEMICONDUCTOR DIODE MATRIX

CROSS-RELATED APPLICATION

This application is a continuation of copending application Ser. No. 221,613 filed Dec. 23, 1971, now abandoned.

This invention relates to a semiconductor diode matrix which may be used in decoders and in memory elements in computers.

Known in the art is a semiconductor diode matrix on a dielectric base layer.

The afore-mentioned semiconductor diode matrix is formed on a sapphire base layer by growing monocrystal silicon with diodes formed in it on the layer. The monocrystal layer is divided into rows, separated from each other by an air spacing. The diodes in a line are joined together with strip buses of semiconductor material and in columns with conductor buses.

In this semiconductor diode matrix, the characteristics of the diodes differ to a large degree since it is not possible to produce a monocrystal silicon film featuring a good reproducibility as to the main characteristics. In addition, the film has a high resistance.

The invention is aimed at providing a semiconductor diode matrix with only slight differences in the characteristics and good reproducibility of the diodes, small resistance of the matrix lines and, therefore, faster action and less power consumption.

This aim is achieved in that a semiconductor diode matrix on a dielectric base layer, in which the diodes are connected together in lines with strip buses of semiconductor material which form one of the regions of each diode, and in columns with conductor buses, the strip buses of semiconductor material, according to the present invention, are located within the body of the dielectric base layer flush with its surface and are surrounded on the side of the base layer by a layer of material having a higher degree of conducitivity than the strip bus material, while the aforementioned strip bus of semiconductor material and the layer surrounding it form one of the conductor buses in the matrix connecting the diodes in lines.

The invention will become more fully understood from the following description of an embodiment thereof read in connection with the accompanying drawing the sole FIGURE of which shows a part of the semiconductor diode matrix.

A semiconductor diode matrix contains a dielectric base layer 1, in which there are cavities filled with a monocrystalline semiconductor which forms strip buses 2 located flash with the surface of the base layer 1. Sital or glass can be chosen as a dielectric for the base layer 1, while silicon with a low density factor can be used as the monocrystalline semiconductor. The chosen dielectric and the silicon have substantially to equal coefficients of thermal expansion. The strips 2 of monocrystalline silicon and the surface of the dielectric base layer 1 are covered with a dielectric film 3, for example, silicon oxide.

Diodes 4 are formed in the strip buses 2 which will further be referred to as lines, and connected in columns with the aid of conductor buses 5. The diodes in each line are connected to the conductor buses 5 by connector links 6. The diodes in each line are connected to each other through the silicon strip buses 2, at the ends of which are contact areas 7. In order to lower the resistance, the strip buses 2 of silicon are separated from the base layer 1 by a layer 8 of material which encircles the strip buses 2 from the side of the base layer 1 and which has a higher degree of conduction than the silicon of which the diodes are made. This layer can be formed for example as a layer of metal or a semiconductor with $p^{++}$ or $n^{++}$ type conduction.

The writing of information into the semiconductor diode matrix (coding) is accomplished after the matrix has been made by disconnecting the diodes 4 from the conductor buses 5, for example, by burning the link 6 through with electrical current, an electron or laser beam or by removing it with mechanical means.

Therefore, after the coding process, each matrix holds information on the word inscribed in it. The presence of a diode between the line and column corresponds to a logical zero, the absence of a diode to a logical unity.

In the above-described matrix, the resistance of the lines has been decreased, the speed of the operation and the radiation immunity increased.

In addition, the cost of producing the matrix is sharply reduced by using one photo-pattern. The user has the opportunity to write information into the diode matrix if necessary.

We claim:

1. A semiconductor diode matrix consisting of: a dielectric base layer having a plurality of longitudinal cavities therein which are transversely spaced apart from one another, said cavities being open at one of the faces of said base layer and having side walls formed by said layer; a strip bus constituted of a single layer of monocrystal semiconductor material disposed in each cavity in said dielectric base layer and having a surface flush with said one face of the base layer; said semiconductor material and the dielectric base layer having substantially equal coefficients of thermal expansion, a plurality of longitudinally spaced semiconductor diodes embedded in the body of said strip bus and having one of the regions thereof formed by the semiconductor material of said strip bus; a single distinct layer of material in each cavity surrounding a respective said strip bus of semiconductor material to completely isolate the same from the side walls and bottom of each cavity of the dielectric base layer, said layer having a higher degree of conductivity than the semiconductor material of said strip bus; a first group of metal conductor buses and said one face of the base layer selectively joining said diodes into columns of the matrix; said diodes being connected to into lines in the matrix by said strip buses of semiconductor material and said layers surrounding the strips, said strips and layers thus forming a second group of conductor buses.

2. A diode matrix as claimed in claim 1 wherein said dielectric base layer is sital or glass.

3. A diode matrix as claimed in claim 1 wherein said base layer includes longitudinal ridges between the cavities which completely isolate each strip and its surrounding conductive layer in one cavity from those in the next adjacent cavity.

4. A diode matrix as claimed in claim 1 comprising transversely spaced contact elements each connected to a respective strip.

5. A diode matrix as claimed in claim 1 comprising a dielectric film cover on the flush surface of the base layer, strips and isolating layers in areas outside the conductor buses.

6. A semiconductor diode matrix as claimed in claim 1 wherein the two-layer bus of semiconductor material includes a first layer of N-type conductivity and a second layer of N⁺-type conductivity.

7. A semiconductor diode matrix as claimed in claim 1 wherein said first layers are of N-type conductivity and form one of the regions of P-N junctions of said diodes.

* * * * *